(12) United States Patent  (10) Patent No.: US 9,087,830 B2
Zhang et al.  (45) Date of Patent: Jul. 21, 2015

(54) SYSTEM, METHOD, AND COMPUTER PROGRAM PRODUCT FOR AFFIXING A POST TO A SUBSTRATE PAD

(75) Inventors: Leilei Zhang, Sunnyvale, CA (US);
Abraham F. Yee, Cupertino, CA (US);
Shantanu Kalchuri, San Jose, CA (US);
Zuhair Bokharey, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 13/427,776

(22) Filed: Mar. 22, 2012

(65) Prior Publication Data

US 2013/0252414 A1  Sep. 26, 2013

(51) Int. Cl.
*H01L 21/44* (2006.01)
*H01L 23/498* (2006.01)
*H01L 25/10* (2006.01)
*H05K 3/40* (2006.01)
*H01L 23/00* (2006.01)

(52) U.S. Cl.
CPC ........ *H01L 23/49811* (2013.01); *H01L 25/105* (2013.01); *H01L 24/16* (2013.01); *H01L 2224/16227* (2013.01); *H01L 2225/1023* (2013.01); *H01L 2225/1058* (2013.01); *H01L 2924/15321* (2013.01); *H05K 3/4015* (2013.01); *H05K 2201/0367* (2013.01)

(58) Field of Classification Search
CPC .......... H05K 1/02; H01L 2224/05647; H01L 2224/13005–2224/13009; H01L 2224/13147; H01L 23/49811
USPC .......................................................... 438/613
See application file for complete search history.

(56) References Cited

U.S. PATENT DOCUMENTS

| | | | |
|---|---|---|---|
| 2003/0042564 A1* | 3/2003 | Taniguchi et al. | 257/438 |
| 2006/0292750 A1* | 12/2006 | James et al. | 438/118 |
| 2008/0241992 A1* | 10/2008 | Lin et al. | 438/106 |
| 2008/0303152 A1* | 12/2008 | Zhang | 257/738 |
| 2011/0089563 A1* | 4/2011 | Kikuchi et al. | 257/738 |
| 2011/0151627 A1* | 6/2011 | Graf et al. | 438/121 |
| 2012/0091597 A1* | 4/2012 | Kwon et al. | 257/777 |
| 2012/0267782 A1* | 10/2012 | Chen | 257/738 |
| 2012/0305305 A1* | 12/2012 | Upadhyayula et al. | 174/261 |

OTHER PUBLICATIONS

Zhang, L. et al., U.S. Appl. No. 13/438,781, filed Apr. 3, 2012.

* cited by examiner

*Primary Examiner* — Shaun Campbell
(74) *Attorney, Agent, or Firm* — Zilka-Kotab, PC

(57) ABSTRACT

A system, method, and computer program product are provided for affixing a post to a substrate pad. In use, a post is affixed to each of one or more pads of a substrate, where each post receives a ball of a package during an assembly process.

13 Claims, 4 Drawing Sheets

SYSTEM, METHOD, AND COMPUTER PROGRAM PRODUCT FOR AFFIXING A POST TO A SUBSTRATE PAD

FIELD OF THE INVENTION

The present invention relates to constructing electronic circuits, and more particularly to constructing electronic circuits using a surface mount method.

BACKGROUND

The construction of electronic circuits is commonly performed utilizing methods such as surface mount technology. However, current techniques for implementing surface mount technology with current components have been associated with various limitations.

For example, a package including a ball grid array may be attached to a substrate during an assembly process. However, when a size of the balls of the ball grid array is reduced, the balls may not be able to connect with the substrate during the assembly process.

There is thus a need for addressing these and/or other issues associated with the prior art.

SUMMARY

A system, method, and computer program product are provided for affixing a post to a substrate pad. In use, a post is affixed to each of one or more pads of a substrate, where each post receives a ball of a package during an assembly process.

DETAILED DESCRIPTION

Figure 1:
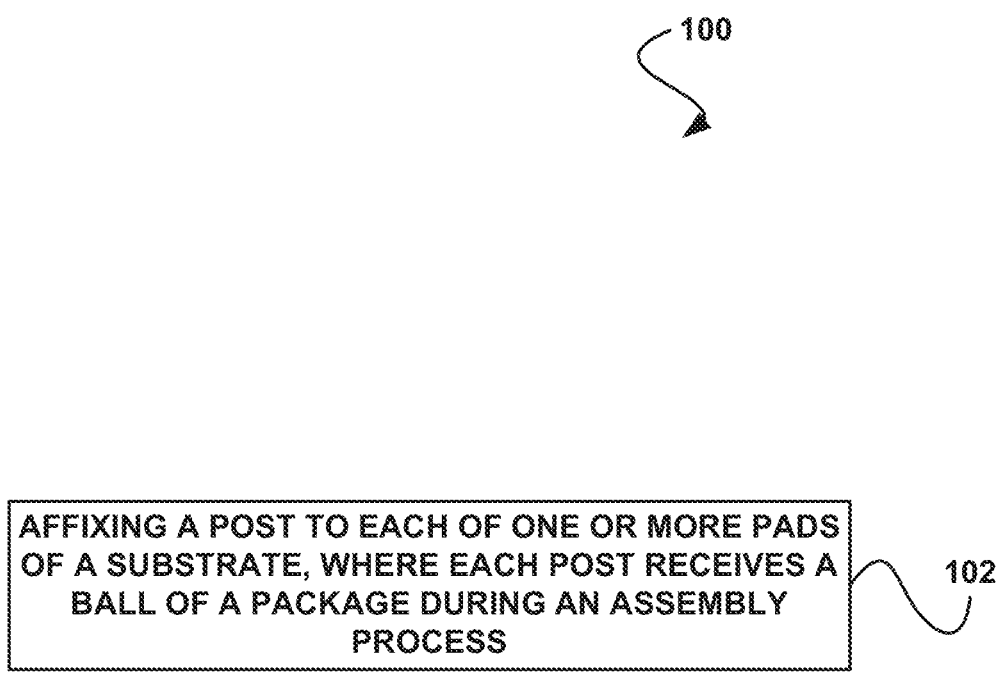
FIG. 1 shows a method for affixing a post to a substrate pad, in accordance with one embodiment.

FIG. 1 shows a method 100 for affixing a post to a substrate pad, in accordance with one embodiment. As shown in operation 102, a post is affixed to each of one or more pads of a substrate, where each post receives a ball of a package during an assembly process. In one embodiment, the package may include one or more silicon based integrated circuits (e.g., a central processing unit (CPU), a graphics processing unit (CPU), a memory unit, etc.).

In another embodiment, the package may include part of a package on package (POP) created using a package on package packaging method. For example, the package may include one or more die layers combined vertically (e.g., stacked, etc.), where one layer is stacked on top of another package. In yet another embodiment, the package may include a ball grid array. For example, the balls of the package may include a plurality of balls coupled to the bottom of the package (e.g., utilizing flux, etc.). In still another embodiment, the package may include a memory pad (e.g., a pad with one or more memory dies mounted to the pad).

Additionally, in one embodiment, the substrate may include a circuit board for receiving one or more components. For example, the substrate may include a circuit board for receiving the package. In another embodiment, the substrate may receive the package through the assembly process. In yet another embodiment, the assembly process may include any type of process for joining the substrate to the package. For example, the assembly process may include a surface mount process, a controlled collapse chip connection (flip chip) process, a hot air reflow process (e.g. a reflow process utilizing a reflow oven, an infrared heater, etc.), etc.

Further, in one embodiment, each ball of the package may include any type of ball used to attach the package to the substrate. For example, each ball of the package may include a solder ball (e.g., a solder sphere). In another embodiment, each ball of the package may be placed below a pad of the package. For example, each ball of the package may be placed on an area of the package (e.g., utilizing flux, etc.) to be connected to an area of the substrate during the assembly process. In yet another embodiment, each ball of the package may be placed on the bottom of the package (e.g., the side of the package to be connected to the top of the substrate).

Further still, in one embodiment, the one or more pads of the substrate may each include an area on the substrate to be connected with an area of the package (e.g., a pad of the package) during the assembly process. In another embodiment, the one or more pads of the substrate (and the one or more pads of the package) may be made of metal (e.g., copper). For example, the one or more pads of the substrate may be affixed to the top of the substrate by printing the pads, silkscreening the pads, laminating the pads, etc. In yet another embodiment, the one or more pads may each include a POP pad (e.g., a pad used in the assembly of a POP, etc.).

Also, in one embodiment, affixing a post to each of one or more pads of the substrate may include attaching a post to each of one or more pads of the substrate, such that a post extends from each of the one or more pads of the substrate in a direction perpendicular to the substrate. In another embodiment, a post may be affixed to each of the one or more pads of the substrate by soldering the post to the pad, casting the post with the pad, etc. In yet another embodiment, a post may be affixed to each of the one or more pads of the substrate through a plating process.

In another embodiment, the one or more posts may be made of metal (e.g., copper, etc.). In yet another embodiment, the post may be constructed of a solid material (e.g., solid metal). In still another embodiment, the post may be cylindrical. In yet another embodiment, when viewed from the top of the post, the post may be square-shaped. In still another embodiment, when viewed from the top of the post, the post may be rectangular-shaped. In another embodiment, the post may have the same shape as a shape of the pad of the substrate to which it is affixed. Of course, however, the post may be shaped in any manner.

In addition, in one embodiment, each post may receive a ball of the package during the assembly process by joining with the solder ball during the assembly process. For example, each post of the substrate may be lined up with a corresponding pad of the package, where a solder ball is affixed to each pad of the package. In another example, heat may be applied to the solder ball, and the solder ball may melt and join with the pad of the package and the post of the substrate lined up with the pad of the package, thereby joining (e.g., connecting, etc.) the pad of the package and the post of the substrate lined up with the pad of the package.

Furthermore, in one embodiment, each of the one or more pads of the substrate may not be able to receive the ball of the package without the one or more posts. For example, one or more integrated circuits may be affixed to the bottom of the package or to the top of the substrate. In another example, the one or more integrated circuits affixed to the bottom of the package or to the top of the substrate may have a die size with a thickness greater than a height of a ball on the package, such that a space may exist between each ball and pad of the substrate, and each ball may be too far from each pad of the substrate to be received by the substrate during the assembly process without the use of the one or more posts.

Further still, in one embodiment, each post affixed to the one or more pads of the substrate may bridge the gap between the ball and the one or more pads of the substrate, and may therefore enable a connection between the one or more pads of the substrate and the one or more pads of the package during the assembly process. In another embodiment, the posts may also prevent a need to use one or more dams on the substrate. For example, one or more dams used to protect the one or more pads of the substrate from contamination during the assembly process may not be needed after a post is affixed to each of the one or more dams.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
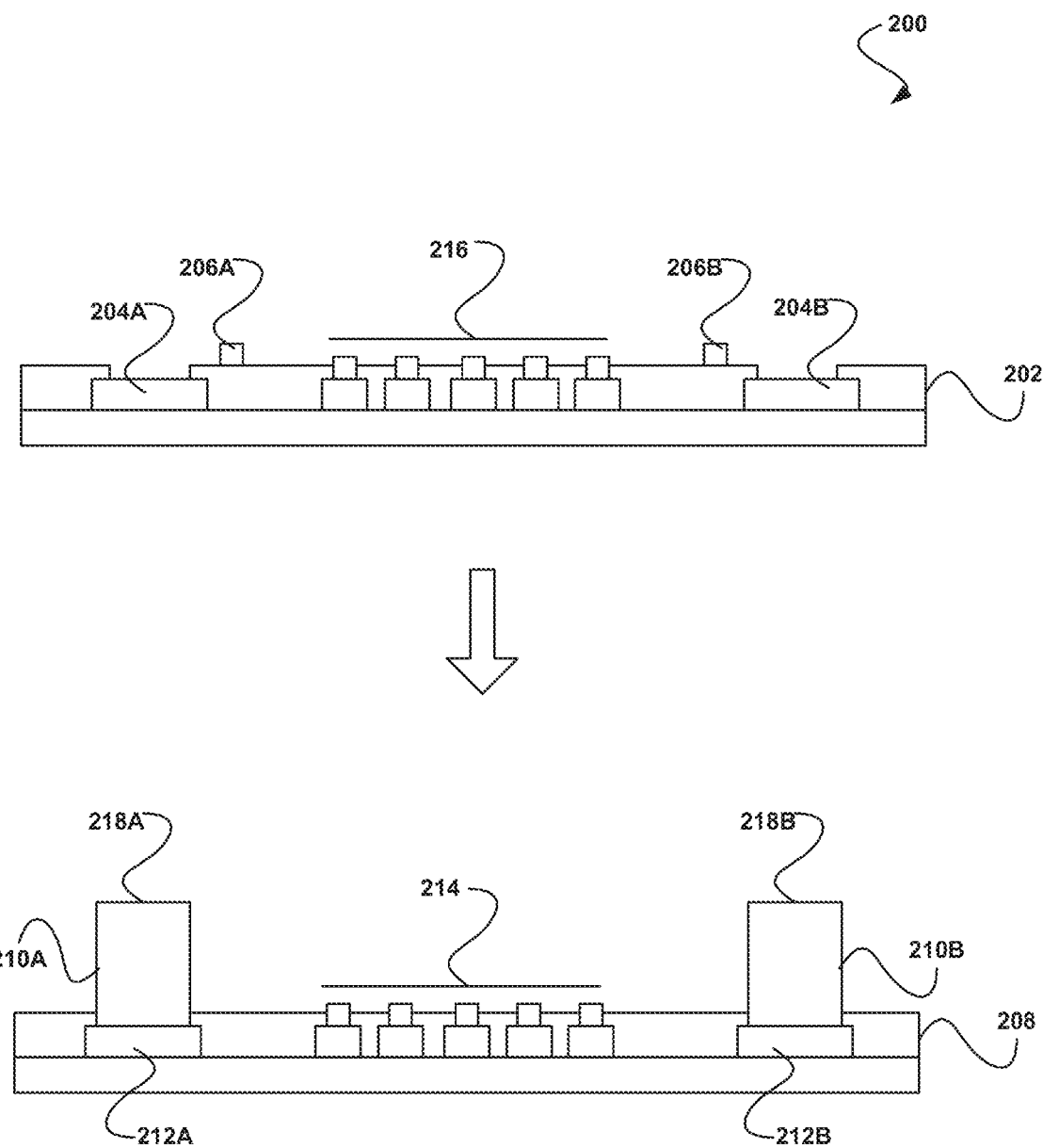
FIG. 2 shows an exemplary package on package substrate structure construction, in accordance with another embodiment.

FIG. 2 shows an exemplary package on package substrate structure construction 200, in accordance with another embodiment. As an option, the substrate structure construction 200 may be carried out in the context of the functionality of FIG. 1. Of course, however, the substrate structure construction 200 may be implemented in any desired environment. It should also be noted that the aforementioned definitions may apply during the present description.

As shown, a first substrate 202 includes POP pads 204A and 204B, as well as solder dams 206A and 206B. In one embodiment, each of POP pads 204A and 204B may include a pad for receiving a solder ball. For example, the first substrate 202 may be included in a POP configuration with another package, and each of POP pads 204A and 204B may include a pad for receiving a solder ball of the other package.

Additionally, in one embodiment, the solder dams 206A and 206B may prevent contamination of the POP pads 204A and 204B. For example, the solder dams 206A and 206B may prevent solder on the first substrate 202 from flowing onto the POP pads 204A and 204B. Further, the first substrate 202 includes a mounting area 216. In one embodiment, the mounting area 216 may receive an integrated circuit (e.g., a memory circuit, a processing circuit, etc.). In another embodiment, a thickness of a die of the integrated circuit may prevent solder balls mounted on another package from connecting with the POP pads 204A and 204B of the first substrate 202.

Further, a second substrate 208 includes two posts 210A and 210B mounted on top of POP pads 212A and 212B. In one embodiment, the posts 210A and 210B may be made of copper. In another embodiment, the top surfaces 218A and 218B of each of the two posts 210A and 210B may receive a solder ball. For example, the top of each of the two posts 210A and 210B may receive a solder ball from another package mounted on top of the second substrate 208. In yet another embodiment, the second substrate 208 includes a mounting area 214. In one embodiment, the mounting area 214 may receive an integrated circuit (IC).

Further still, in one embodiment, each of the two posts 210A and 210B may enable the second substrate 208 to receive (e.g., come into contact with, etc.) solder balls mounted on another package when the thickness of a die mounted on the mounting area 214 prevent the solder balls from coming into contact with the POP pads 212A and 212B. In another embodiment, no solder dams (e.g., the solder dams 206A and 206B of the first substrate 202) may be necessary with the second substrate 208. For example, the two posts 210A and 210B may prevent solder from coming into contact with the top surfaces 218A and 218B of each of the two posts 210A and 210B (e.g., by blocking the solder since solder does not flow upward, etc.).

Figure 3:
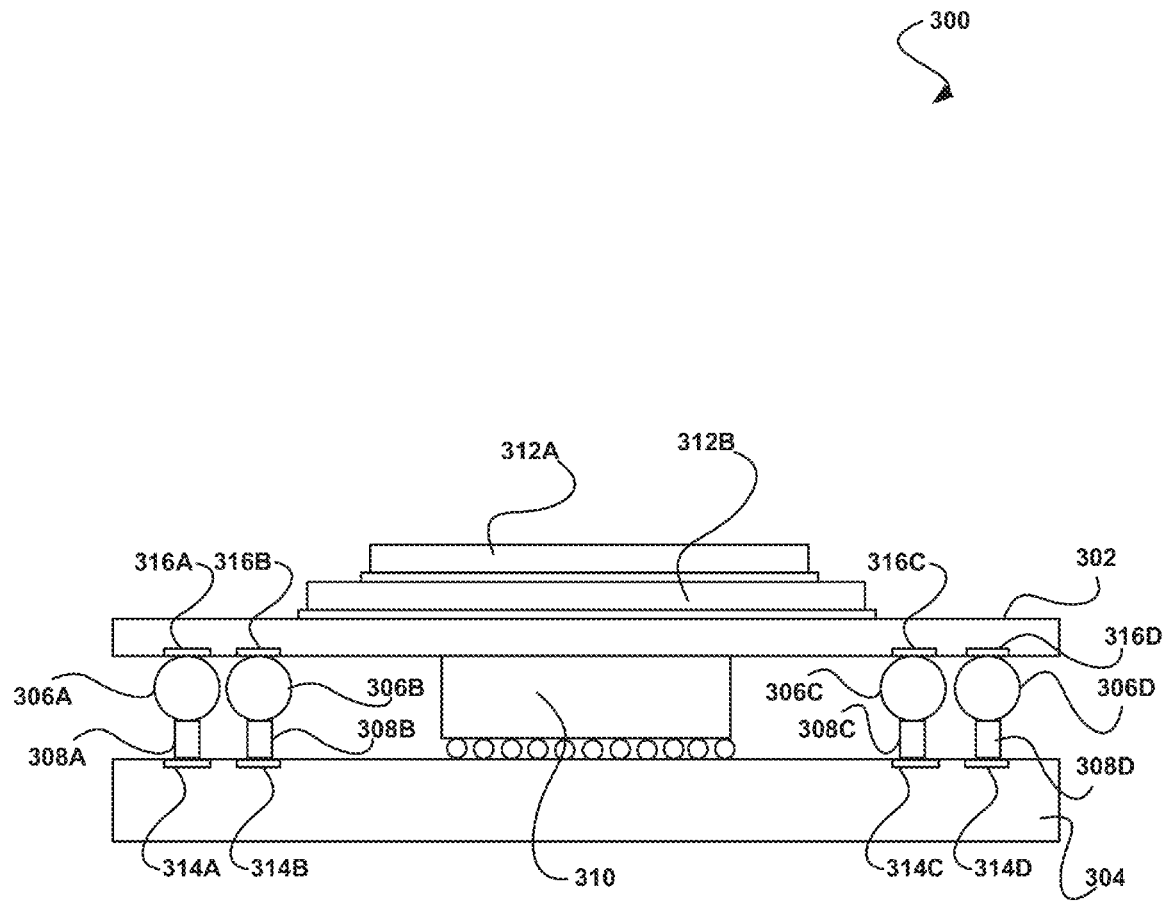
FIG. 3 shows an exemplary package on package assembly, in accordance with yet another embodiment.

FIG. 3 shows an exemplary package on package assembly 300, in accordance with another embodiment. As an option, the present package on package assembly 300 may be carried out in the context of the functionality of FIGS. 1 and 2. Of course, however, the package on package assembly 300 may be implemented in any desired environment. It should also be noted that the aforementioned definitions may apply during the present description.

As shown, a top package 302 including solder bans 306A-D mounted to pads 316A-D is placed on top of a bottom substrate 304 including posts 308A-D. Additionally, the bottom substrate 304 includes a mounted integrated circuit 310, and the top package 302 includes stacked memory dies 312A and 312B. In one embodiment, the mounted integrated circuit 310 of the bottom substrate 304 may prevent the solder balls 306A-D of the top package 302 from coming into contact with pads 314A-D of the bottom substrate 304 located beneath the posts 308A-D of the bottom substrate 304.

Additionally, the tops of the posts 308A-D of the bottom substrate 304 may come into contact with the solder balls 306A-D of the top package 302, such that when heat is applied to the package on package assembly 300 during an assembly process, the solder balls 306A-D may melt and connect the pads 316A-D of the top package 302 with the posts 308A-D of the bottom substrate 304.

In this way, if a pitch (e.g., diameter, etc.) of the solder balls 306A-D of the top package 302 is reduced, a thickness of the mounted integrated circuit 310 of the bottom substrate 304 may not need to be reduced in order to connect the top package 302 with the bottom substrate 304, which may reduce warping of the bottom substrate 304. For example, the posts 308A-D may each have a height of 60 um, the pitch of the solder balls 306A-D may each be 40 um, and the thickness of the mounted integrated circuit 310 may be as high as 100 um for the top package 302 to connect with the bottom substrate 304.

Figure 4:
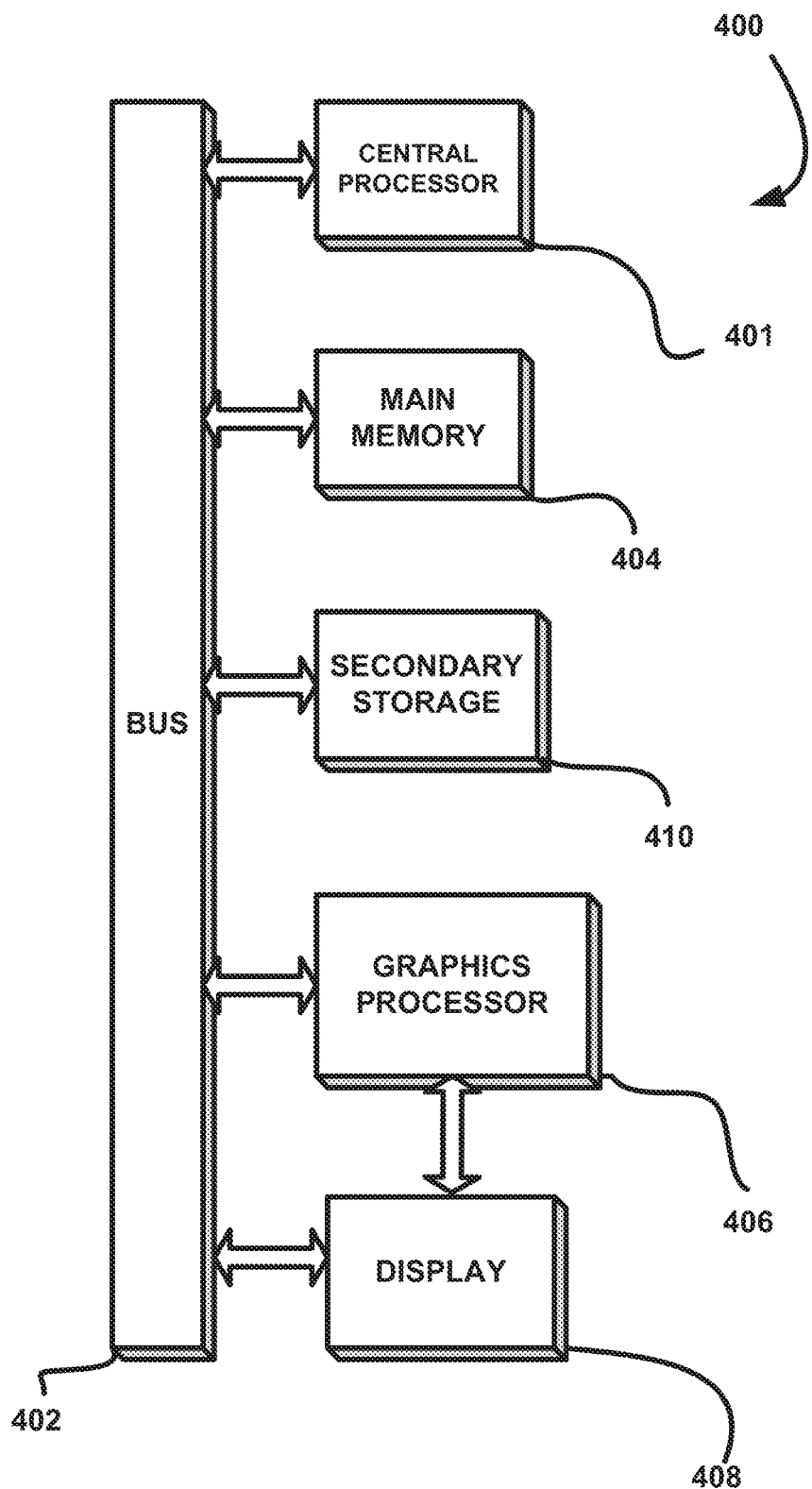
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one host processor 401 which is connected to a communication bus 402. The system 400 also includes a main memory 404. Control logic (software) and data are stored in the main memory 404 which may take the form of random access memory (RAM).

The system 400 also includes a graphics processor 406 and a display 408, i.e. a computer monitor. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 400 may also include a secondary storage 410. The secondary storage 410 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

In one embodiment, the architecture and/or functionality of the various previous figures may be implemented in the context of the host processor 401, graphics processor 406, an integrated circuit (not shown) that is capable of at least a portion of the capabilities of both the host processor 401 and the graphics processor 406, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, laptop computer, and/or any other type of logic. Still yet, the system 400 may take the form of various other devices m including, but not limited to a personal digital assistant (PDA) device, a mobile phone device, a television, etc.

Further, while not shown, the system 400 may be coupled to a network [e.g. a telecommunications network, local area network (LAN), wireless network, wide area network (WAN) such as the Internet, peer-to-peer network, cable network, etc.) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
    affixing a first end of a post to each pad of one or more pads of a substrate, wherein the post comprises a copper material that extends above a top surface of the substrate; and
    joining a second end of each post affixed to the substrate to a ball of a package, wherein the package includes a ball-grid array affixed to a bottom layer of the package and the height of each ball of the package is less than a thickness of an integrated circuit mounted to a mounting area on the substrate, and wherein each post is supported at the first end of the post and not embedded within a material that substantially encloses a vertical surface of the post when the second end of the post is joined to the ball of the package,
    wherein the package is mounted to the substrate above the integrated circuit, and
    wherein the extension of the post above the top surface of the substrate prevents solder from flowing upward onto a top surface of the post during a mounting process of the integrated circuit.

2. The method of claim 1, wherein the substrate includes a circuit board for receiving the package.

3. The method of claim 2, wherein the integrated circuit is coupled to the mounting area via a ball-grid array of the integrated circuit.

4. The method of claim 3, wherein the integrated circuit is a memory circuit.

5. The method of claim 1, wherein each ball of the package comprises a solder ball.

6. The method of claim 1, wherein the one or more pads of the substrate each include an area on the substrate to be connected with a corresponding pad of the package.

7. The method of claim 1, wherein affixing a post to each pad of the one or more pads of the substrate includes attaching a post to each pad of the one or more pads of the substrate, such that the post extends from the pad in a direction perpendicular to the substrate.

8. The method of claim 1, wherein a post is affixed to each pad of the one or more pads of the substrate through a plating process.

9. The method of claim 1, wherein each post is made of copper.

10. The method of claim 1, wherein each post receives the ball of the package via a hot air reflow process.

11. The method of claim 1, wherein each post is lined up with a corresponding ball of the package.

12. The method of claim 1, wherein the package comprises a graphics processor and the substrate comprises a printed circuit board.

13. An apparatus, comprising:
    a substrate including one or more pads, wherein each pad is affixed to a first end of a post comprising a copper material that extends above a top surface of the substrate;
    an integrated circuit mounted to a mounting area on the substrate; and
    a package including a ball-grid array affixed to a bottom layer of the package, wherein each ball of the ball-grid array is joined to a second end of a post affixed to the one or more pads of the substrate, wherein the height of each ball of the package is less than a thickness of the integrated circuit, and wherein each post is supported at the first end of the post and not embedded within a material that substantially encloses a vertical surface of the post when the second end of the post is joined to the ball of the package,
    wherein the package is mounted to the substrate above the integrated circuit, and
    wherein the extension of the post above the top surface of the substrate prevents solder from flowing upward onto a top surface of the post during a mounting process of the integrated circuit.

* * * * *